United States Patent
Gopal Samy et al.

(12) United States Patent (10) Patent No.: US 10,353,016 B2
(45) Date of Patent: Jul. 16, 2019

(54) SYSTEM AND METHOD FOR FAULT MANAGEMENT IN LIGHTING SYSTEMS

(71) Applicant: SIGNIFY HOLDING B.V., Eindhoven (NL)

(72) Inventors: Mathan Kumar Gopal Samy, Tarrytown, NY (US); Mahmoudreza Sharifi, Croton On Hudson, NY (US); Dagnachew Birru, Yorktown Heights, NY (US)

(73) Assignee: SIGNIFY HOLDING B.V., Eindhoven (NL)

( * ) Notice: Subject to any disclaimer, the term of this patent is extended or adjusted under 35 U.S.C. 154(b) by 301 days.

(21) Appl. No.: 14/760,503

(22) PCT Filed: Dec. 26, 2013

(86) PCT No.: PCT/IB2013/061338
§ 371 (c)(1),
(2) Date: Jul. 13, 2015

(87) PCT Pub. No.: WO2014/111775
PCT Pub. Date: Jul. 24, 2014

(65) Prior Publication Data
US 2015/0355290 A1    Dec. 10, 2015

Related U.S. Application Data

(60) Provisional application No. 61/753,192, filed on Jan. 16, 2013.

(51) Int. Cl.
*G01R 31/00* (2006.01)
*G01R 31/44* (2006.01)
*H05B 37/03* (2006.01)
*G01R 31/24* (2006.01)
*G01R 31/26* (2014.01)

(52) U.S. Cl.
CPC ............ *G01R 31/44* (2013.01); *H05B 37/03* (2013.01); *H05B 37/034* (2013.01); *G01R 31/24* (2013.01); *G01R 31/2635* (2013.01)

(58) Field of Classification Search
CPC .... G01R 31/44; G01R 31/24; G01R 31/2635; H05B 37/03; H05B 37/034
USPC .......................................................... 702/58
See application file for complete search history.

(56) References Cited

U.S. PATENT DOCUMENTS

| | | | |
|---|---|---|---|
| 8,271,834 B2 * | 9/2012 | Yildiz | G06F 11/0748 714/2 |
| 2009/0060494 A1 | 3/2009 | Renner | |
| 2011/0153271 A1 | 6/2011 | Tiwary | |

(Continued)

FOREIGN PATENT DOCUMENTS

EP        2113750 A2    11/2009

*Primary Examiner* — Huan Hoang (57) ABSTRACT

This invention discloses a method and apparatus for managing lighting systems is disclosed. The method comprises performing a training phase for a plurality of settings wherein the training is represented by statistical parameters associated with a statistical model and then performing a monitoring phase to monitor the lighting system, determining whether characteristics of the monitored lighting system correspond to the model obtained during the training phase and determining an error exists when the monitored lighting system is not within tolerance values of the statistical parameters.

20 Claims, 6 Drawing Sheets

(56) References Cited

U.S. PATENT DOCUMENTS

| | | | |
|---|---|---|---|
| 2011/0178977 A1 | 7/2011 | Drees | |
| 2012/0147733 A1* | 6/2012 | Wang | H04L 41/082 370/216 |
| 2014/0142905 A1* | 5/2014 | Drees | G06F 17/5009 703/2 |
| 2015/0069920 A1* | 3/2015 | Denteneer | H05B 37/03 315/152 |

* cited by examiner

SYSTEM AND METHOD FOR FAULT MANAGEMENT IN LIGHTING SYSTEMS

CROSS-REFERENCE TO PRIOR APPLICATIONS

This application is the U.S. National Phase application under 35 U.S.C. § 371 of International Application No. PCT/IB2013/061338, filed on Dec. 26, 2013, which claims the benefit of U.S. Provisional Patent Application No. 61/753,192, filed on Jan. 16, 2013. These applications are hereby incorporated by reference herein.

This application is related to the field of lighting and more particularly to a system and method for fault detection in lighting systems.

Centralized facility management systems provide devices and standards for integration of building automation with information systems and networks. Some of the current control systems provide the scheduling and monitoring of energy systems. Though limited fault monitoring strategies are already implemented, the systems can be significantly enhanced by adding advanced lighting monitoring strategies.

Generally, advanced control systems are being increasingly deployed in buildings to reduce energy consumption. However, there are very limited automated mechanisms to verify whether these systems are operating as intended. In some cases, simple malfunctions may remain un-detected for several years or may even lead to a catastrophic failure before they are detected. Maintenance at this point is not only expensive but also incurs waste of energy during the faulty operations.

However, facility managers are still deployed in each building to monitor and mitigate issues. In some building types, such as retail stores, local facility management is not available. Thus, scheduled maintenance is the best course of action. In such cases, if lights are burned-out, they typically wait for several lights to burn-out before maintenance is scheduled. This can create loss of quality of light until maintenance is implemented; affecting customer experience.

Thus, while centrally managed faulty detected systems are being deployed, there remains a need in the industry to install an automated system that can detect failures of lighting systems, and automatically notify building operators for scheduled maintenance.

It is the object of the invention claimed to provide a method and system for fault detection of lighting systems where a group of lights are controlled through a controller. The controller uses the feedback from light sensors and energy meters to check whether the current light setting matches the scheduled/intended light setting.

In one aspect of the invention, light intensity sensors are positioned to measure the approximate level of light and/or power generated in an area, determine a statistical distribution of the level and integrate the statistical distribution with a distribution of power consumption in order to evaluate the health condition of the lighting and light control systems.

In another aspect of the invention, training and monitoring of a lighting system are used to evaluate the health of the lighting and light control system. In the training period, light and power consumption statistical distributions from different light settings are determined and quantified. In the monitoring phase, a current light intensity and power use are compared to the statistically determined parameters obtained during the training period to check whether the health of the lighting and light control system is within expected norms.

In one aspect of the invention, a method for managing lighting in an environment is disclosed, wherein the method comprises performing a training phase, said training phrase comprising, obtaining a plurality of samples for each of a plurality of settings; and determining statistical parameters associated with said obtained plurality of samples for each of the plurality of settings and performing a monitoring phase, said monitoring phase comprising obtaining measurement samples for each of a plurality of settings in a selected one of said plurality of settings; determining a parameter associated with the measurement samples, determining whether said parameter is within a threshold with respect to said statistical parameters for a corresponding one of said plurality of settings; and indicating an error when said parameter is not within said threshold.

In another aspect of the invention, an apparatus for managing lighting within an environment is disclosed. The apparatus comprises a processor in communication with a memory, the memory including code, which when accessed by the processor causes the processor to: perform a training phase, said training phrase comprising obtaining a plurality of samples for each of a plurality of settings; and determining statistical parameters associated with said obtained plurality of samples for each of the plurality of settings; and perform a monitoring phase, said monitoring phase comprising: obtaining measurement samples for each of a plurality of settings in a selected one of said plurality of settings; determining a parameter associated with the measurement samples; determining whether said parameter is within a threshold with respect to said statistical parameters for a corresponding one of said plurality of settings; and indicating an error when said parameter is not within said threshold.

In another aspect of the invention, a computer-program product is disclosed wherein the computer program product is stored on a non-transitory medium, the computer program product when loaded into a processor causes the processor to: perform a training phase, said training phase generating a model representation of a lighting system for each of a plurality of settings; and perform a monitoring phase, wherein a parameter, associated with a setting, obtained during said monitoring phase is compared to statistical parameters representing said model; and indicating an error when said parameter is outside a threshold with respect to said statistical parameters.

The advantages, nature, and various additional features of the invention will appear more fully upon consideration of the illustrative embodiments to be described in detail in connection with accompanying drawings wherein like reference numerals are used to identify like element throughout the drawings.

It is to be understood that the figures and descriptions of the present invention described herein have been simplified to illustrate the elements that are relevant for a clear understanding of the present invention, while eliminating, for purposes of clarity, many other elements. However, because these eliminated elements are well-known in the art, and because they do not facilitate a better understanding of the present invention, a discussion of such element is not provided herein. The disclosure herein is directed to also variations and modifications known to those skilled in the art.

Figure 1A:
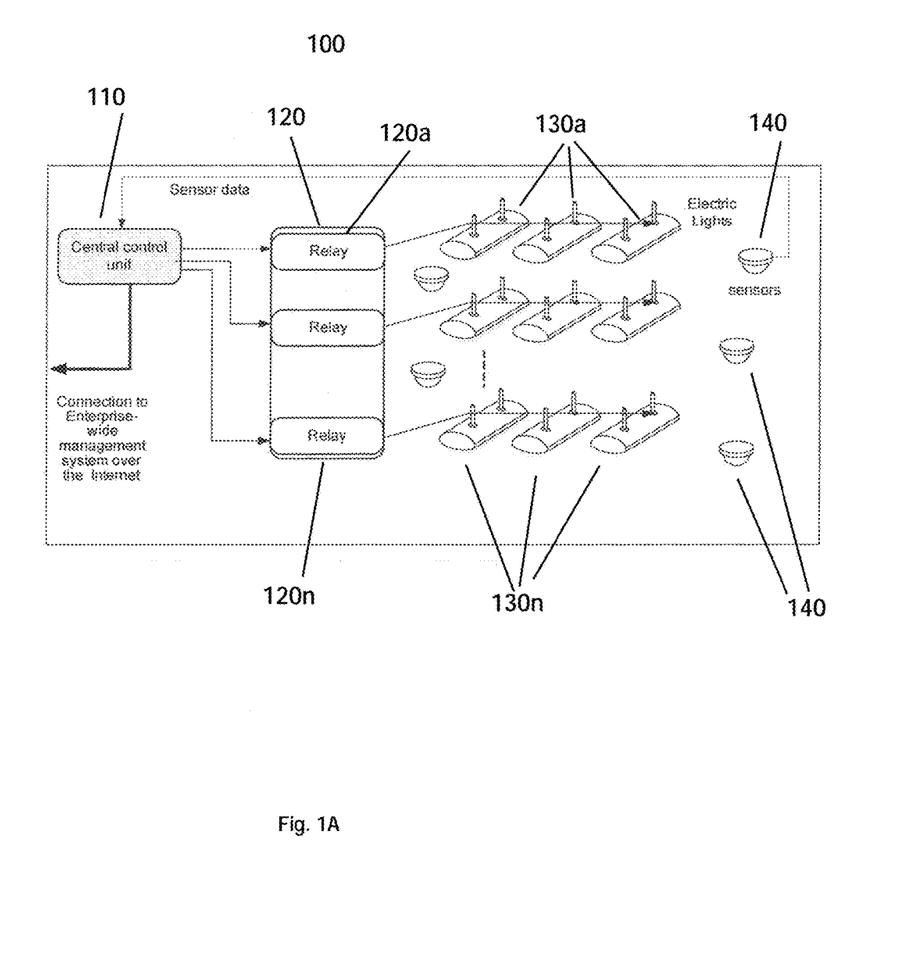
FIG. 1A illustrates a conventional lighting system

FIG. 1 A illustrates a conventional light system 100 comprising a central control unit 110 that is connected to a plurality of relays 120a-120n. Each relay, for example 120a, is connected to a corresponding lighting elements 130a-130n. Lighting elements 130a-130n provide illumination to one or more areas. The lighting system 100 further includes a plurality of sensors 140 that measure illumination at selected points within a corresponding area. Relays 120a-120n may be used to control (e.g., turn on, turn off, dim) corresponding light elements 130a-130n under the control of the central control unit 110.

The central control unit 110 may be connected via one or more networks (not shown), such as the internet, to an enterprise wide management system that may provide further control information regarding the operation of the lighting elements 130a-130n.

Figure 1B:
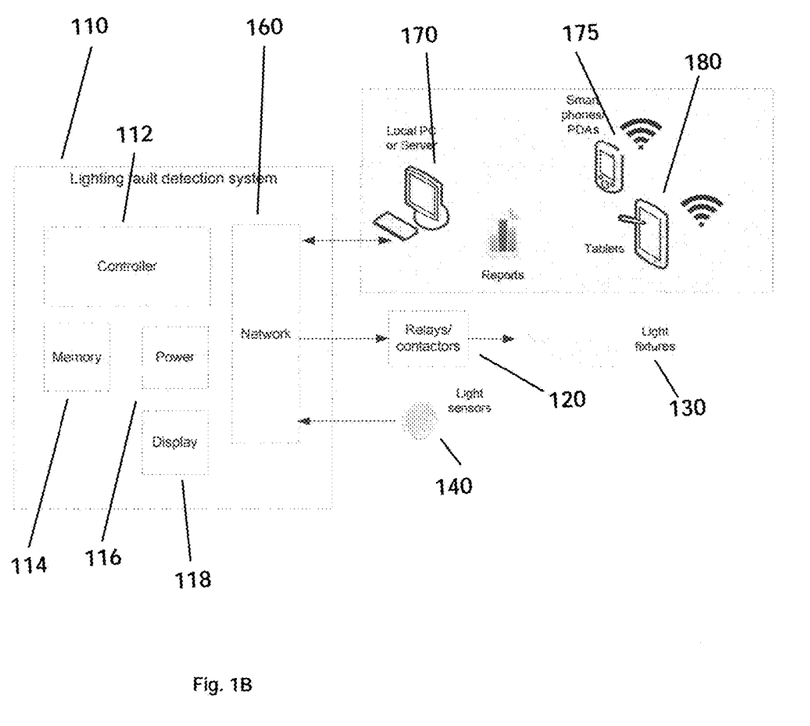
FIG. 1B illustrates a conventional lighting system network configuration.

FIG. 1B illustrates, in further detail, the connection of central control unit (or server) 110 in communication with relays 120, which provide control signals to light elements or fixtures 130 (i.e., 130a-130n). Light sensors 140, which are distributed about an area illuminated by one or more of the light elements 130a-130n, provide information regarding illumination levels within the area to control unit 110. The central control unit 110 may communicate with the relays 120 and light sensors 140 through a network connection 160. The network connection 160 may be an internal network or an external network, such as the internet, intranet, Local Area Network, Wide-Area Network, etc. Protocols (e.g., TCP/IP) for transmitting/receiving information over a network connection, whether internal or external, are well known in the art and need not be discussed in detail herein.

The central control unit 110 may also be in communication with devices that allow a user to view a status of the lighting system 100. For example, the central control unit 110 may be in communication with one or more devices, such as a local personal computer or a network based server 170, one or more smart phones 175 and/or tablets 180. The communication between the control unit 110 and the one or more devices 170, 175, 180 may be wired or wireless, and/or a combination of wired and wireless networks.

Central control unit 110 may comprise a controller 112, a memory 114, a power unit 116 and a display unit 118. The controller 112 may include a special purpose processor, or a general purpose processor, which may access code or software that renders the general purpose processor a special purpose processor, and/or dedicated hardware (e.g., FPGA, ASIC) that is programmed to perform the processing described herein. The memory 114 may include code (software instruction) which when accessed by the controller 112 causes the controller 112 to perform the processing described herein. The results of the processing may be displayed on display 118 or may be transmitted via the network to one or more devices 170, 175, 180.

Power unit 116 provides power to the components of the central control unit 110.

The sensors (light, energy, power, etc.,) 140 and actuators (relays) 120 may be networked to the control unit 110 either by a wired connection or a wireless connection. The network block 160 manages the communication between the sensors 140, actuators 120 and communication devices 170, 175, 180. For example, a computer or server may determine the status of lighting and training process by continuously polling the system 100. Remote access of a computer or server to the system 100 may be made possible through an Ethernet connectivity, for example. In this manner, a facility director at a remote location may initiate and track the training, self-verification and monitoring processes of system 100. The remote server or computer may also generate reports that detail all the internal details and information about the training, verification and monitoring processes. Such reports can be used by maintenance teams to fix identified fault(s). The server may also enable user access to initiate a training phase and/or monitor a monitoring phase of the lighting system through smartphones 175, PDAs, tablet devices 180, etc.

Figure 2:
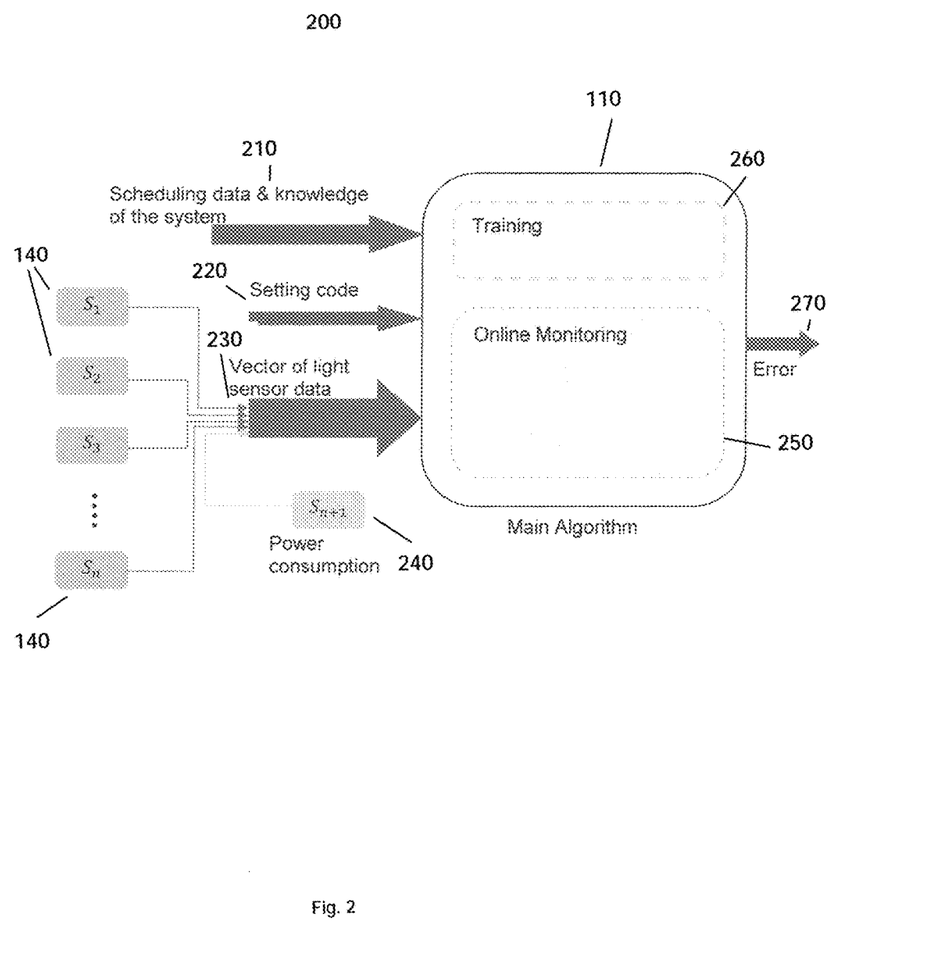
FIG. 2 illustrates a block diagram of information flow in accordance with the principles of the invention.

FIG. 2 illustrates a block diagram of an exemplary process 200 in accordance with the principles of the invention.

In this exemplary processing, information 230 obtained from sensors 140 (designated as S1, S2 . . . Sn) are provided to a training system 260 and a monitoring system 250 within control unit 110. In addition, an optional power consumption sensor 240 provides information regarding the power consumption of the lighting system.

In addition, scheduling data and knowledge information regarding the lighting system 100 are provided to the control unit 110. The scheduling data may include expected times that the lighting elements 130 within the illumination system are active or inactive. The knowledge of the system information may include information regarding user interaction with the illumination system 100 (e.g., turn on/turn off, dim).

Setting codes 220 may further be provided to control unit 110. Setting codes may include information regarding expected settings of the illumination system.

In accordance with the principles of the invention, a command from the control unit 110 specifies which lighting elements 130 are to be turned-on and which lighting elements 130 are to be turned-off. A third input signal, provided to the control unit 110, represents a feedback signal from the light sensors 140 that is used to modify and/or adjust the control (turn-on/turn-off/dim) process. The control unit 110 processes these three inputs and generates an output 270. The output 270 is a signal that specifies an error code. When the system has no error, the error code value is set to a predefined number (e.g., 0). However, when an error is detected and, depending on the type of the error, the error code is set to a non-zero value, for example. Different values may be used to identify specific errors that have been determined in the lighting system.

However, the specific value or representation of an error code in not critical. Thus, a translation from an error code value to a particular fault may be performed by maintaining a list of possible error values and their corresponding faults.

Figure 3:
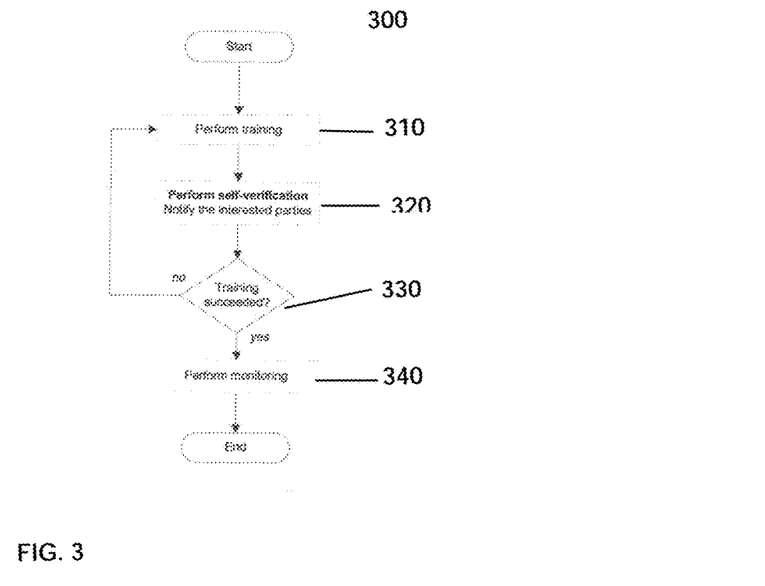
FIG. 3 illustrates a flow chart of an exemplary process in accordance with the principles of the invention.

FIG. 3 illustrates a flowchart of an exemplary process 300 in accordance with the principles of the invention.

In this exemplary process, after installation, the system automatically trains itself for the lighting environment of the lighting system 100 at step 310. Training may, for example, determine types of conditions that cause lights to be turned-on or turned-off. For example, the conditions may be based on time of day, or on weather conditions. Thus, in one aspect the lighting elements 130 may be turned on from 8 AM to 6 PM Monday-Friday and from 1 PM to 5 PM Saturday and Sunday. Some of the lighting elements may be turned off at all other times, while others may be maintained in a dimmed or reduced power state. In addition, if motion sensing is available (i.e., sensor 140), then a motion sensor signal may determine that selected lighting elements may be turned on upon detection of motion even if the time of day is outside the expected turn-on time period. In another aspect of the invention, the lighting elements may be turned on during periods of adverse weather conditions even outside of the expected turn-on time period.

After the training phase is completed, the system may perform a self-verification process at step 320. When the verification process is successful, the system proceeds with normal fault detection or monitoring phase at step 340. However, if the self-verification process fails, then the training process is repeated at step 330.

Although not shown, it would be recognized that whether the verification process indicates training has been or has not been successful, registered users will be notified of the verification results.

In addition, in the training phase, lighting commands as well as sensor data are used to make a supervised training. In one exemplary embodiment of the invention, different lighting settings are modeled in a system as a Gaussian model, for example. A Gaussian model may be represented by a mean value and a covariance matrix.

As would be appreciated the training mode may be iterative and thus, may repeat itself for a predetermined number of times before proceeding to the self-verification or monitoring phase.

In the training process, lighting commands as well as the sensor data is used to make a supervised training. Each of a plurality of different lighting settings is modeled, for the purposes of describing the principles of the invention, as a Gaussian model, which is represented by a mean value and a covariance matrix. Although, the training model is based on a Gaussian model, it would be recognized that other types of modeling of the lighting system and the usage of other types of models may be performed without altering the scope of the invention.

In the training phase, assuming that $x_i^{<k>}$ is a vector that represents measured value of light intensities for the $i^{th}$ device when the light setting is k, then $x_i^{<k>}$ represents $$x_i^{<k>} = (x_{i_1}^k\, x_{i_2}^k \ldots x_{i_m}^k).$$

where $x_{i_1}^k$ is the light intensity for the $i^{th}$ sensor when the light setting is k.

The mean and covariance matrix of a Gaussian model used to model the lighting conditions may be determined as:

$$\mu_i^{<k>} = \left(\frac{i-1}{i}\right)\mu_{i-1}^{<k>} + \left(\frac{1}{i}\right)x_i^{<k>},$$

$$\sum_i^{<k>} = \left(\frac{i-2}{i-1}\right)\sum_{i-1}^{<k>} + \left(\frac{1}{i-1}\right)(x_i^{<k>} - \mu_{i-1}^{<k>})^T(x_i^{<k>} - \mu_{i-1}^{<k>}).$$

where $\mu_i^{<k>}$ is the mean value at step i for when the light setting code is k, and
$\Sigma_i^{<k>}$ is the covariance matrix at step i for when the light setting code is k.

The training phase may be summarized as:

Step 1: Take a new set of light sensor data: $x^{<k>}$
Step 2: Obtain a scenario code from the controller: j
Step 3: Add the newly measured set to the scenario group $x^{<k>} \in C_j$
Step 4: If training time is less than total training time go to step 1
Step 5: Otherwise, find the mean value and covariance of each setting group $\mu^{<k>}, \Sigma^{<k>}$ When the training phase is completed, the system automatically switches to either the self-validation or the monitoring phase. In an aspect of the invention shown in FIG. 3, a self-verification phase is included.

In the self-verification phase, initially the values associated with the model (e.g., mean and covariance matrix of a Gaussian model) of different light setting are compared to each other to insure the system has a correct number of distinct models. For example, if there are 3 different light settings (i.e., k=3), there should be 3 different statistical values (i.e., mean and covariance matrix values for a Gaussian model) associated with each setting. Otherwise, there is a fault in the system during the training phase. In this case, the training phase is repeated.

However, if the training data is correct and the number of distinct statistical values is equal to the number of different settings, the real-time monitoring starts at step 340.

Figure 4:
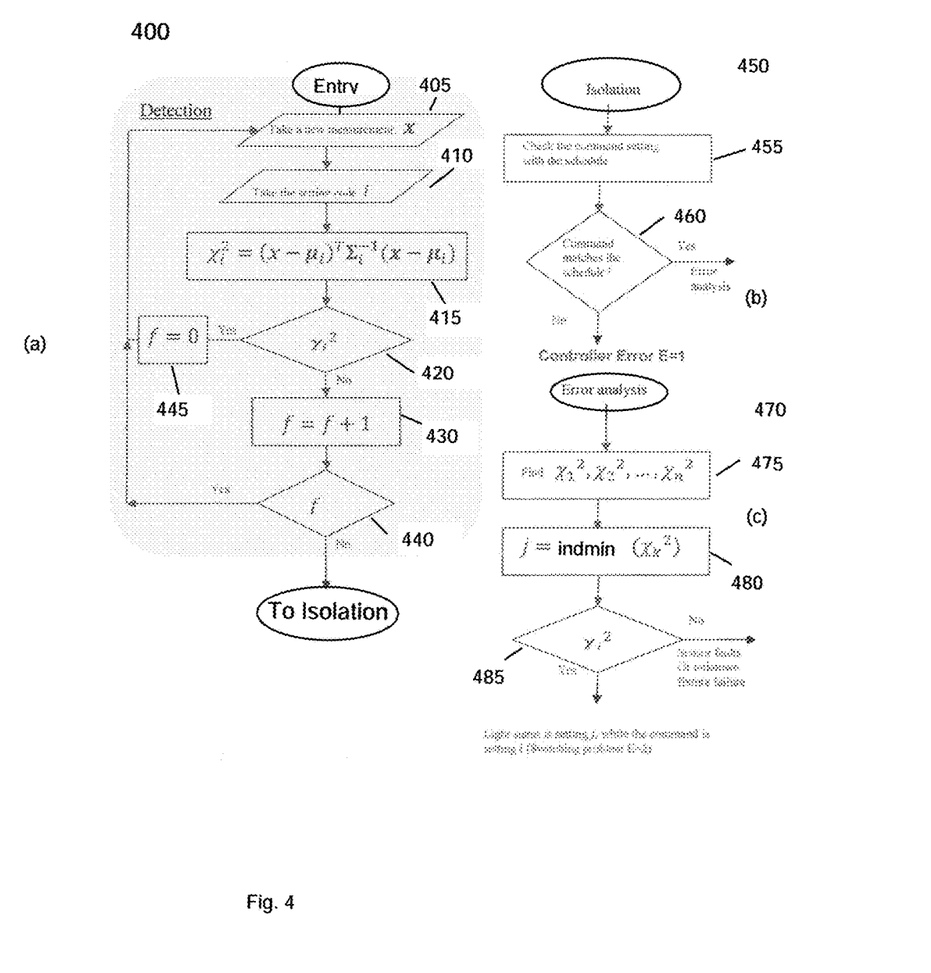
FIGS. 4(a)-(c) illustrate flow charts of an exemplary monitoring process in accordance with the principles of the invention.

A flow chart of an exemplary process for a monitoring phase is shown in FIGS. 4(a)-4(c) illustrate flow charts of exemplary processing showing how FIG. 4(a) illustrates a first phase of the monitoring phase, wherein at step 405 a measurement through one or more sensors is taken and at step 410 a setting code, i, is obtained.

A Chi-Squared distribution, for example, is computed based on the distribution information of the expected light setting at step 415. The Chi-Squared distribution utilizes the mean and variance values of the exemplary Gaussian model to obtain an updated value based on the measurement taken at step 405.

$$\chi_i^2 = (x_i^{<k>} - \mu_{i-1}^{<k>})^T \Sigma_i^{<k>-1}(x_i^{<k>} - \mu_{i-1}^{<k>})$$

If the Chi Square value is within a threshold (step 420), a determination is made that the system is healthy and a count of a number of consecutive faults (f) is reset at step 445.

In the online monitoring processing described herein, there are two key parameters for detection of errors; the threshold of the Chi-Squared function, $\epsilon$, and a number, n, of consecutive errors, f, before generation of a system report error. The Chi Squared threshold has a known value based on the significant probability and a degree of freedom of the Chi Squared variable. In one aspect of the invention, the degree of freedom may be selected to be the same as the number of sensors.

The parameter, n, determines the robustness of system. The higher the value n, the less number of false alarms is determined. However, assigning too big a value of n will slow-down the time to detection a fault. Therefore, n, may be determined depending on the sampling rate of the sensor data. For example, if the sampling rate is one (1) sample per minute and n is set to 10, it takes at least 10 minutes before a fault may be reported. It would be appreciated that the sampling rate and the value n may be varied to satisfy a user's requirements and such variation of one or both values does not alter the scope of the invention.

However, when an error is determined (step 440), then an isolation algorithm is implemented (see FIG. 4(b)).

The online monitoring algorithm shown in FIG. 4(a) may be summarized as:

---

Step 1: Take a new set of light sensor data: $x^{<k>}$
Step 2: Take the setting code from the controller: i
Step 3: Calculate the $\chi_i^2$ for group i : $\chi_i^2 = (x - \mu_i)^T \Sigma_i^{-1} (x - \mu_i)$
Step 4: If the $\chi_i^2 < \epsilon_i$, set f = 0 then go to step 1
Step 5: set f = f + 1
Step 6: if f < n go to step 1
Step 7: if f ≥ n report error, go to Isolation phase.

---

FIG. 4(b) represents a flow chart of an exemplary process 450 for isolating the cause of the determined fault. At step 455, determination is made whether the error or fault is due to an incorrect controller command or an incorrect execution. This is done by checking the system command with an expected scheduling. If the command fails to match the schedule, then an error code is set to a predetermined number (e.g., 1). However, if the command matches the schedule, then an error analysis is performed.

FIG. 4(c) represents a flow chart of an exemplary process 470 for analyzing the detected fault.

In the exemplary process shown in FIG. 4(c), at step 475 the system calculates the chi-squared values for all trained light setting using its corresponding statistical properties. At step 480, the system finds the light setting with minimum value of chi-squared. Then, at step 485 a check is made whether this new chi squared value is within a threshold or not. If it is within the threshold, it means that the light setting is known by the system but it is not the correct light setting. If not, the lighting system has a different issue (e.g. several fixtures have failed)

In another aspect of the invention, after the training phase is complete, a self-verification process may be implemented.

Figure 5:
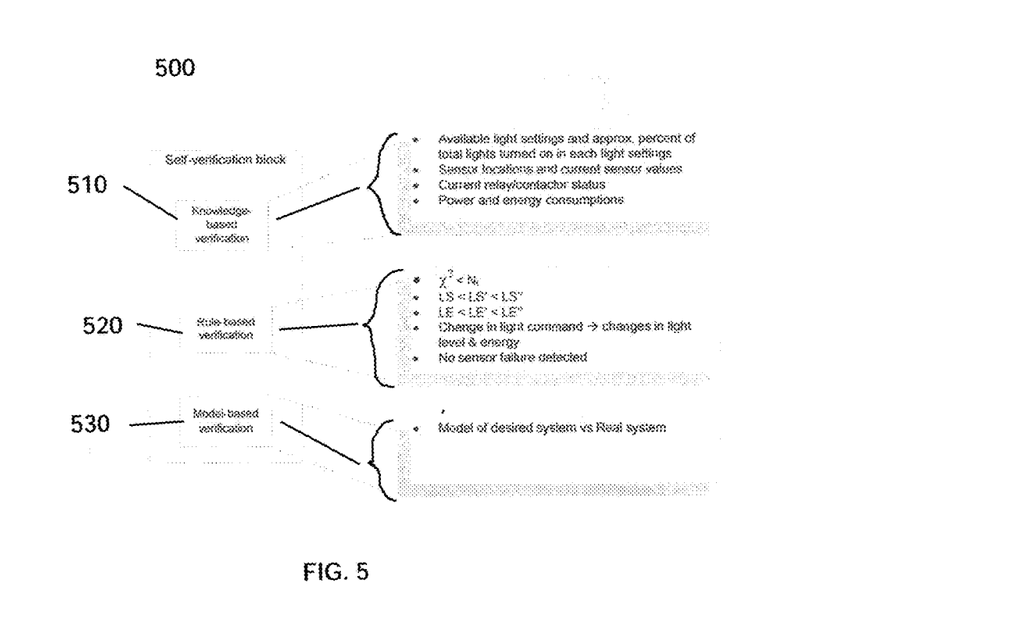
FIG. 5 illustrates a block diagram of an exemplary verification process is accordance with the principles of the invention.

FIG. 5 illustrates a flow chart of an exemplary process 500 for self-verification. Self-verification may be performed by one or more of a knowledge-based system 510, a rule-base system 520 and/or a model based system 530.

In a knowledge-based system 510 information regarding available light settings, sensor location, relay status and/or power and energy consumption may be utilized to determine whether the values determined in the training phase are appropriate. For example, available light settings may be defined as; 100% lights ON, 50% lights ON, 0% light ON etc.

In a rule-based system 520, rules are established to determine whether the values determined in the training phase are appropriate. For example, the rules for verification may be one or more of:

1. The chi-square statistics ($\chi_i^2$) calculated while training for a light setting i should be within training threshold ($N_{th}'$).

$\chi_i^2 < N_{th}'$

Typically, $N_{th}'$ is set higher than $N_{th}$ (which is used during monitoring).

2. An average light level of the space for setting $LS_i$ shall not exceed that of setting $LS_j$ when $LS_i$ has less number of lights turned on compared to setting $LS_j$ $L_i < L_j$ 3. An average power consumed by lighting in setting $LS_i$ shall not exceed that of setting $LS_j$ when $LS_i$ has less number of lights turned on compared to setting $LS_j$ $P_i < P_j$ 4. A change in light setting during training should produce specific changes in light level and average power consumption (increase or decrease depends on the current and previous light setting).

5. No sensor failure was detected during the training process. This can be verified in several ways, for example, by checking for expected range of the light sensor outputs or by residual analysis for sensor fault detection In a model based system 530, a basic model for the lighting system can be developed based on the knowledge on the lighting and measured data. Such a model can be used for online verification of the training process whose output will be compared with that of the model.

Figure 6:
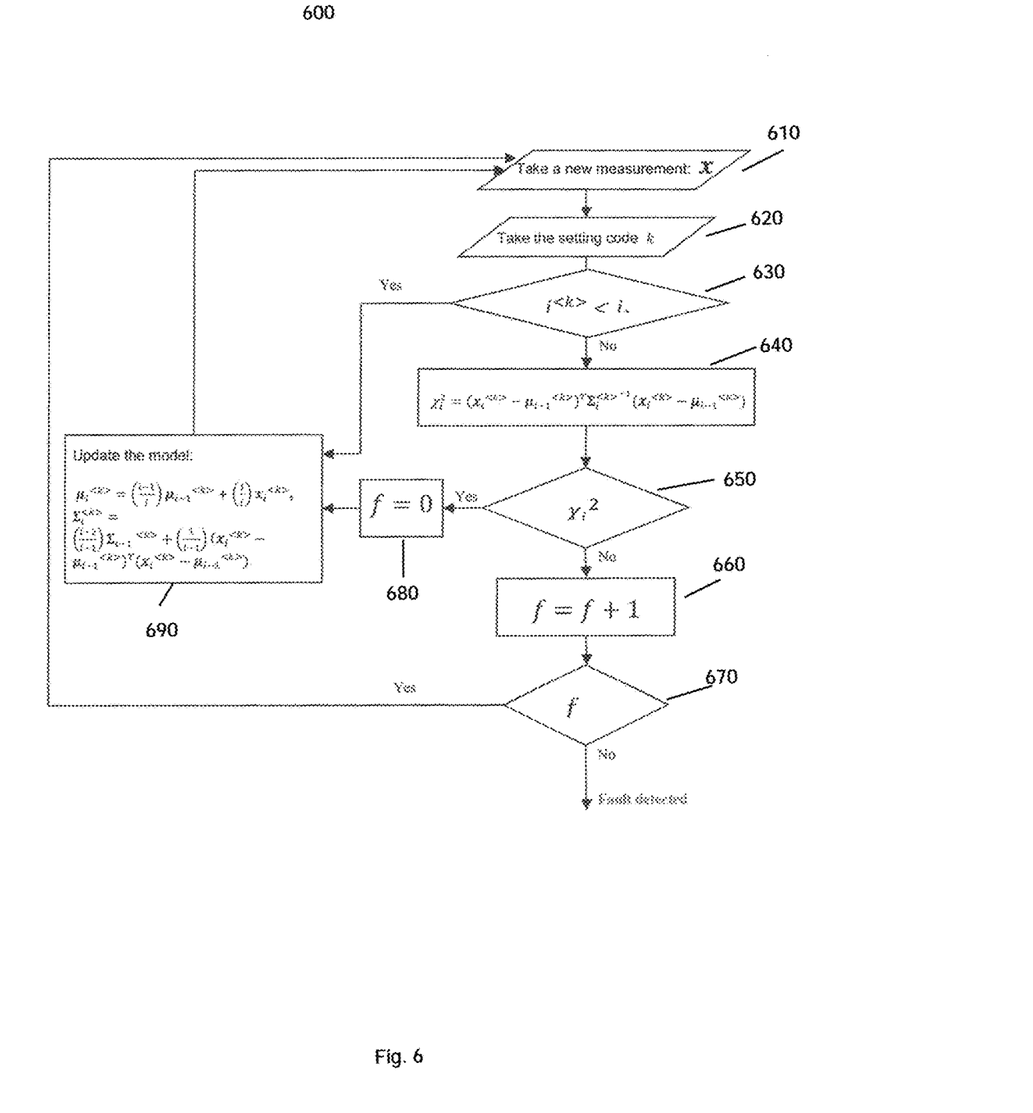
FIG. 6 illustrates an exemplary monitoring process in accordance with still another aspect of the invention.

FIG. 6 illustrates a further embodiment of the monitoring process of the invention, wherein a measurement x is taken at step 610 and the setting code k is obtained at step 620. At step 630, a determination is made whether a sample $i^{<k>}$ is less than a threshold value. If the sample $i^{<k>}$ is less than the threshold value, then the model values are updated at step 690 and processing continues to take another sample 610.

However, if the sample $i^{<k>}$ is greater than the threshold value, then processing continues to step 640 to determine a Chi-Squared distribution value, as discussed with regard to FIG. 4(a).

A determination is then made, at block 650, whether the determined Chi-Squared distribution value is below a threshold. If the Chi-Squared distribution value is less than the threshold, then the count of a number of consecutive errors (f) is reset (step 680) and the model is updated (step 690).

However, if the Chi-Squared distribution value is greater than the threshold, then the count of the number of consecutive errors (f) is increased (step 660). A determination is made at block 670 whether the number of consecutive errors (f) is greater than a threshold value. If the value f is less than the threshold, then a new measurement is taken at block 610. However, if the value off is greater than the threshold, then a fault is detected and processing continues as described with regard to FIG. 4(a)-4(c).

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote non-transitory recording medium or a non-transitory machine readable medium and to be stored on a local recording medium, so that the methods described herein can be rendered in such software that is stored on the recording medium using a general purpose computer(s), or a special processor(s) or in programmable or dedicated hardware(s), such as an ASIC or FPGA. As would be understood in the art, the computer(s), the processor(s), microprocessor controller(s) or the programmable hardware(s) include memory components, e.g., RAM, ROM, Flash, etc. that may store or receive software or computer code that when accessed and executed by the computer(s), processor(s) or hardware(s) implement the processing methods described herein. In addition, it would be recognized that when a general purpose computer(s) accesses code for implementing the processing shown herein, the execution of the code transforms the general purpose computer(s) into a special purpose computer(s) for executing the processing shown herein.

The processing shown herein for training, self-verification and monitoring for lighting systems may be implemented on a dedicated controller(s). Depending on the need for signal processing, a secondary processor may be required (e.g. digital signal processor). An on-chip memory may be augmented by a non-volatile external memory device where the system states and variables are stored and retrieved upon hardware reset. In addition, an on-board power supply circuits may use either battery or AC/DC source. The system may include an in-built or an externally interfaced display to show the progress and result of the training (and monitoring) process.

The terms "a" or "an" as used herein are to describe elements and components of the invention. This is done merely for convenience and to give a general sense of the invention. The description herein should be read to include one or at least one and the singular also includes the plural unless indicated to the contrary.

The term "comprises", "comprising", "includes", "including", "as", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "or" refers to an inclusive "or" and not to an exclusive "or". For example, a condition A or B is satisfied by any one of the following: A is true (or present) and B is false (or not present); A is false (or not present) and B is true (or present); and both A and B are true (or present).

While there has been shown, described, and pointed out fundamental and novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A method, operable in a processing system, for determining faults in a lighting system, said method comprising:
    performing a training phase, said training phrase comprising,
        determining a plurality of settings when portions of the lighting system are to be turned-on or turned-off;
        obtaining a plurality of samples for each of the plurality of settings;
        determining light and/or power statistical parameters associated with said obtained plurality of samples for each of the plurality of settings; and
    performing a monitoring phase, said monitoring phase comprising:
        obtaining measurement samples for each of the plurality of settings;
        determining a parameter associated with the measurement samples;
        determining whether said parameter is within a threshold with respect to said statistical parameters for a corresponding one of said plurality of settings;
        generating a system error report when said parameter is not within said threshold; and
        scheduling maintenance based on the system error report to correct identified faults.

2. The method of claim 1, further comprising:
    performing a verification phase on each of said statistical parameters, said verification phase comprising: at least one of a knowledge based system, a rule based system and a model based system.

3. The method of claim 1, wherein said statistical parameters represent a statistical model.

4. The method of claim 3, wherein said statistical model is a Gaussian model represented by a mean and a covariance matrix.

5. The method of claim 1, wherein said threshold is dependent upon a required response time.

6. The method of claim 5, wherein said required response time is dependent upon a sample rate.

7. The method of claim 1, further comprising:
    determining whether said error report is generated based on one of: a command error and a fault.

8. The method of claim 7, further comprising:
    determining a minimum value among a plurality of said parameters; and
    indicating a failure if said minimum value is less than an error threshold value.

9. The method of claim 1, wherein said error report includes determining a threshold of a Chi-Squared function by monitoring a number of consecutive errors in the lighting system and a robustness parameter of the lighting system, based on a sampling rate of the measurement samples.

10. An apparatus for determining faults in a lighting system comprising:
    a processor in communication with a memory, the memory including code, which when accessed by the processor, causes the processor to:
        perform a training phase, said training phrase comprising,
            determining a plurality of settings when portions of the lighting system are to be turned-on or turned-off
            obtaining a plurality of samples for each of the plurality of settings; and
            determining light and/or power statistical parameters associated with said obtained plurality of samples for each of the plurality of settings; and
        perform a monitoring phase, said monitoring phase comprising:
            obtaining measurement samples for each of a plurality of settings;
            determining a parameter associated with the measurement samples;
            determining whether said parameter is within a threshold with respect to said statistical parameters for a corresponding one of said plurality of settings; and
            generating a system error report when said parameter is not within said threshold; and
            scheduling maintenance based on the system error report to correct identified faults.

11. The apparatus of claim 10, wherein said processor further accessing said code to:
    perform a verification phase on each of said statistical parameters, said verification phase comprising:
        at least one of a knowledge based system, a rule based system and a model based system.

12. The apparatus of claim 10, wherein said statistical parameters represent a statistical model.

13. The apparatus of claim 12, wherein said statistical model is a Gaussian model represented by a mean and a covariance matrix.

14. The apparatus of claim 10, wherein said threshold is dependent upon a required response time.

15. The apparatus of claim 14, wherein said required response time is dependent upon a sample rate.

16. The apparatus of claim 10, wherein said processor further accessing said code to:
determine whether said error report is generated based on one of: a command error and a fault.

17. The method of claim 16, wherein said processor further accessing said code to:
determining a minimum value among a plurality of said parameters; and
indicating a failure if said minimum value is less than an error threshold value.

18. The apparatus of claim 10, wherein said plurality of samples in said training phase is obtained by one of: measurement and manual input.

19. A computer-program product comprising a plurality of computer based instructions stored on a non-transitory medium, said computer program product when accessed by a processor causes the processor to:
determine a plurality of settings when portions of the lighting system are to be turned-on or turned-off;
perform a training phase, said training phase generating a light and/or power model representation of a lighting system for each of the plurality of settings;
perform a monitoring phase, wherein a parameter, associated with a setting, obtained during said monitoring phase is compared to statistical parameters representing said model; and
generate a system error report when said parameter is not within said threshold; and
schedule maintenance based on the system error report to correct identified faults.

20. The computer-program product according to claim 19, wherein said processor further:
performs a validation phase, said validation phase being based on one of: a knowledge based system, a rule based system and a model based system.

* * * * *